United States Patent [19]

Gallagher, Sr.

[11] Patent Number: 5,012,925
[45] Date of Patent: May 7, 1991

[54] PACKAGE FOR SLIDABLY HOUSING COMPONENTS

[75] Inventor: Robert E. Gallagher, Sr., Harrisburg, Pa.

[73] Assignee: AMP Incorporated, Harrisburg, Pa.

[21] Appl. No.: 530,387

[22] Filed: May 30, 1990

[51] Int. Cl.⁵ .................. B65D 85/30; B65D 81/00
[52] U.S. Cl. .................................. 206/332; 206/334; 206/564
[58] Field of Search ............... 206/328, 331, 332, 334, 206/564; 361/220

[56] References Cited

U.S. PATENT DOCUMENTS

| | | | |
|---|---|---|---|
| 3,184,056 | 5/1965 | Kisor | 206/331 |
| 3,435,949 | 4/1969 | Suverkropp | 206/332 |
| 4,487,315 | 12/1984 | Azuma | 206/334 |
| 4,515,269 | 5/1985 | Hashimoto | 206/334 |
| 4,632,246 | 12/1986 | Brutosky | 206/328 |
| 4,671,407 | 6/1987 | Brutosky | 206/332 |
| 4,842,137 | 6/1989 | Gallagher, Sr. | 206/328 |
| 4,944,651 | 7/1990 | Bogar | 206/334 X |

*Primary Examiner*—Bryon P. Gehman
*Attorney, Agent, or Firm*—Katherine A. Nelson

[57] ABSTRACT

A package (10) includes a top (12), vacuum or thermoformed, and a bottom (50) of extruded plastic, with the top and bottom formed to define channels to receive components (80) in sliding engagement to facilitate automatic loading therein and unloading. The components (80) slidingly supported by a rail (54) extending from the bottom between legs of components. A lock (86) is provided to extend through the package to hold components therein. A multiple unit breakaway package (110) is also disclosed.

6 Claims, 5 Drawing Sheets

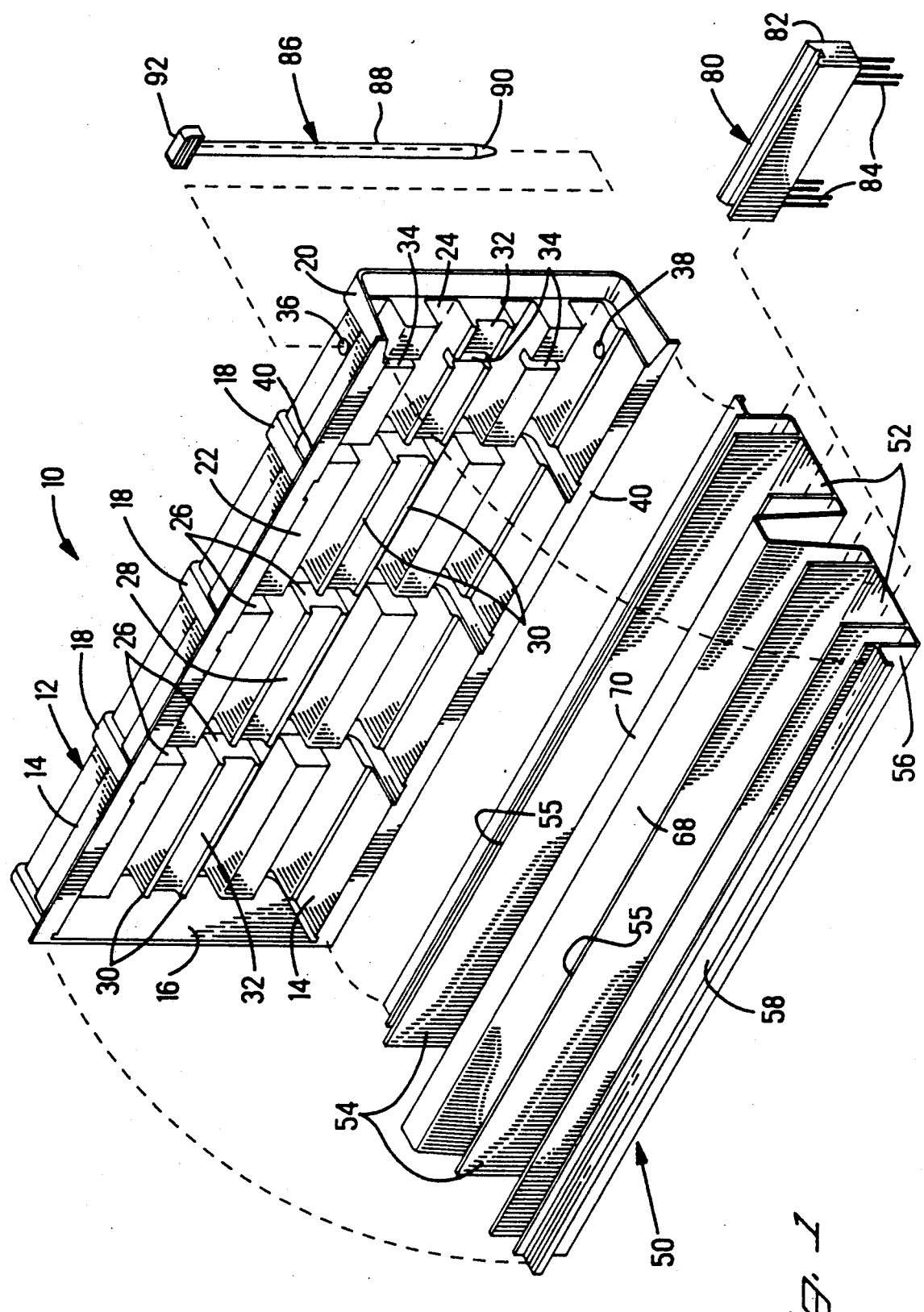

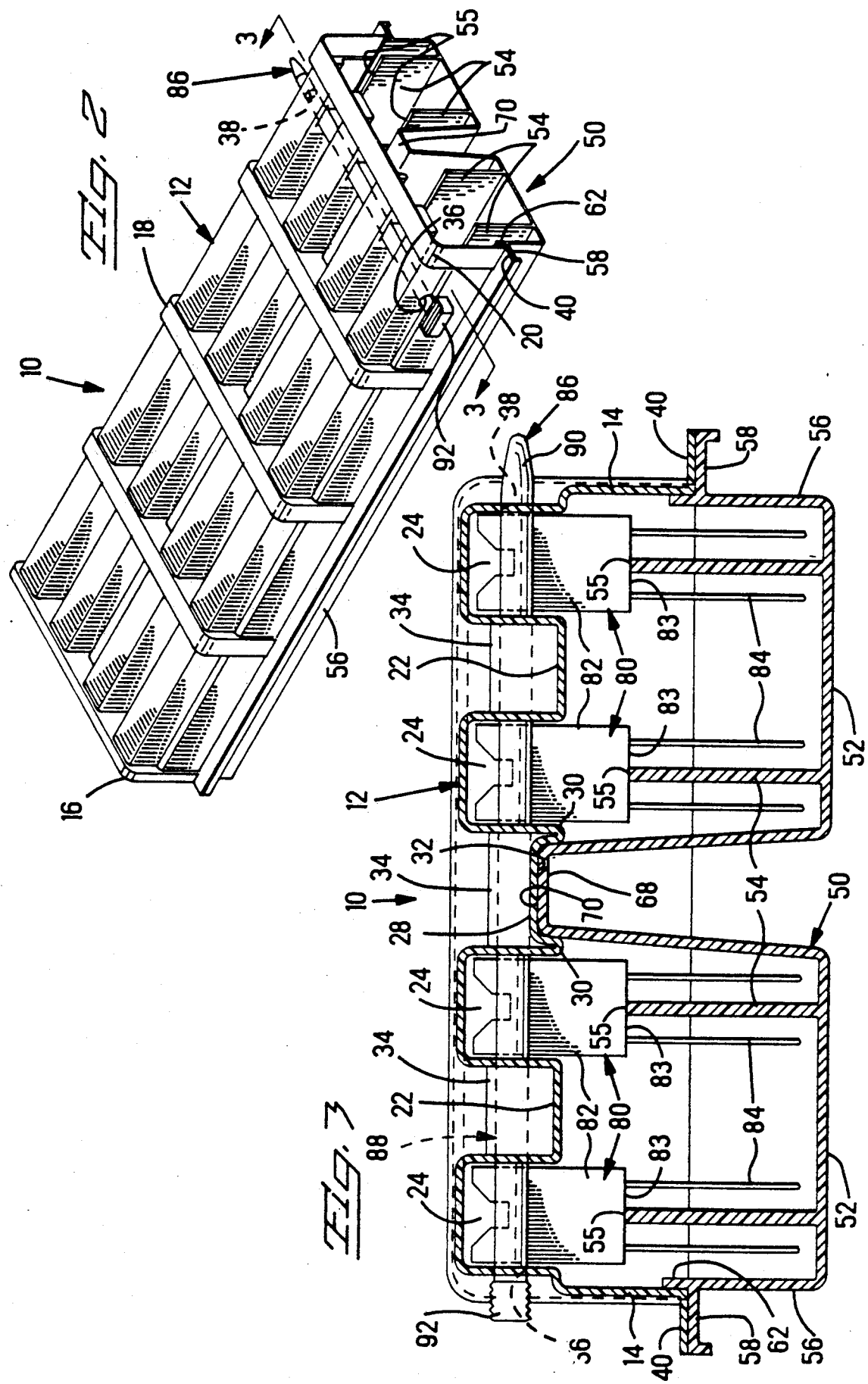

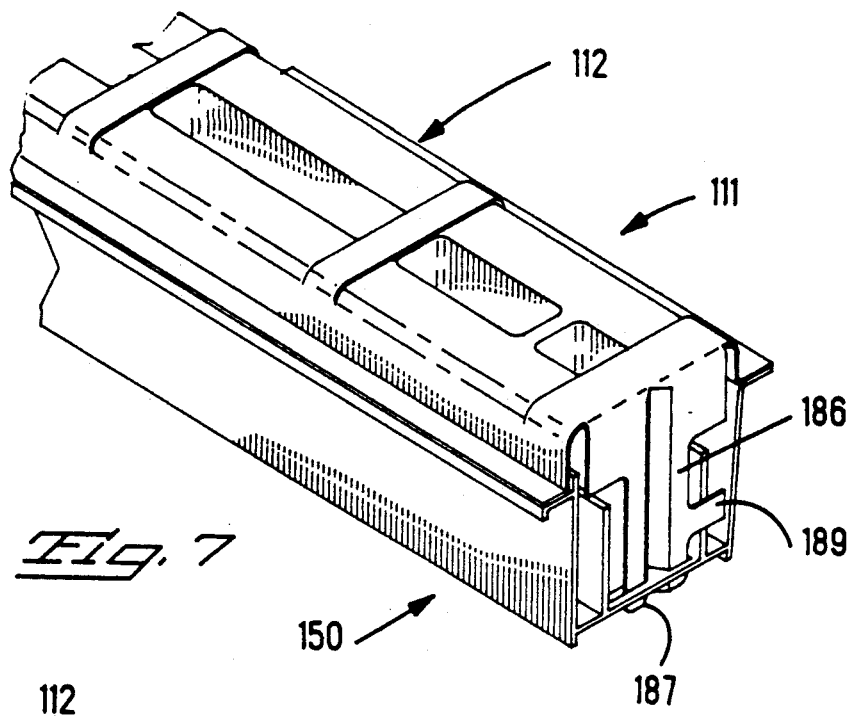
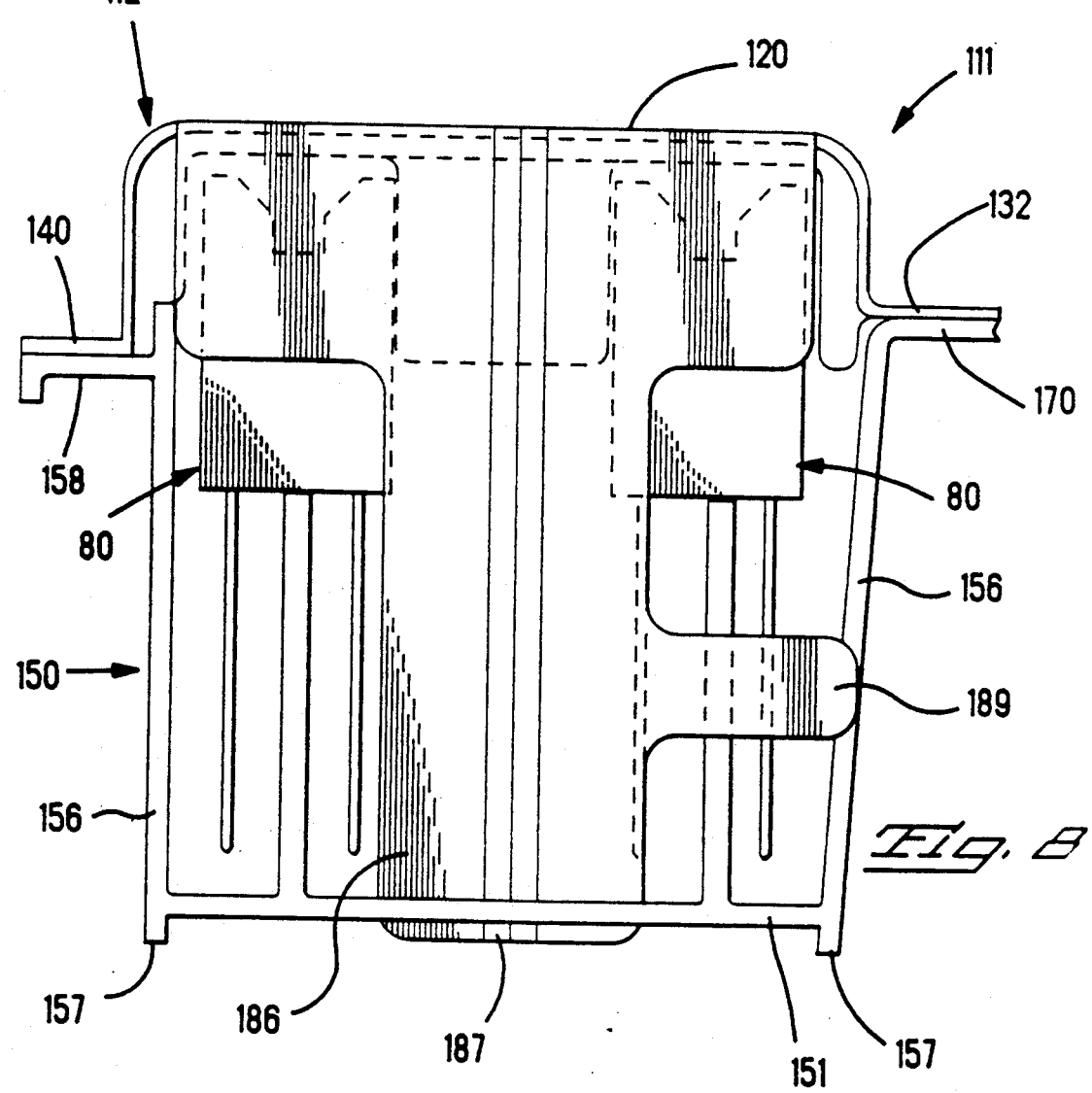

PACKAGE FOR SLIDABLY HOUSING COMPONENTS

This invention relates to a package for housing components such as electrical connectors in a manner facilitating automatic loading and unloading of such components.

BACKGROUND OF THE INVENTION

In U.S. Pat. No. 4,842,137 granted June 27, 1989, a high density magazine for electrical connectors and components is taught featuring the use of a thin polyvinyl chloride which is vacuum formed. The package is assembled from two outer members which are essentially identical and which have cavities into which the components are fitted. The components disclosed are connectors having a body with rows of terminals extending therefrom which are held suspended within a given cavity by portions of the package which engage the lower edge surfaces of the component bodies.

In U.S. Pat. No. 4,671,407 granted June 9, 1987, an alternative package is taught for carrying components such as card edge connectors for use with automatic storage and retrieval systems. This particular package is termed a tray and is vacuum formed using a thin polyvinyl chloride as a material formed to define channels which receive connectors with the terminals thereof made to straddle projections from the bottom of the package and be confined by engagement with the top of the package in a manner allowing the components to slide along the package for loading and unloading.

It is important with respect to both the foregoing that the packages be lightweight and allow a high density packaging of components and yet be structurally strong to avoid crushing of such components upon stacking of packages or due to any twisting or tendency of the packages to become crushed in their use of transporting connectors or components from their place of manufacture to the place of use.

While the packages detailed in the above-mentioned patents function quite well to serve the intended purpose for the particular components shown, the use of, in essence, three layers of packaging material, as in U.S. Pat. No. 4,842,137, adds both cost of material and cost of handling to the package relative to its assembly and use. With respect to components such as connectors having relatively long, fragile legs spaced relatively close together, the package of U.S. Pat. No. 4,671,407 in which the bottom and the top portions are vacuum formed, has proven difficult for use with such connector components due essentially to the difficulties of vacuum or thermal forming of thin sheet materials by the vacuum or heat or both such processes.

Accordingly, it is an object of the invention to provide a package for components which facilitates loading and unloading and which can be rendered utilizing less material for a given function than heretofore available. It is a further object to provide a package which facilitates a sliding engagement of components carried therein wherein the components have relatively long, fragile leg elements disposed in rows spaced relatively close together. It is a still further object to provide a package containing channels having solid rail sections therein facilitating the mounting of components for sliding engagement therewith.

SUMMARY OF THE INVENTION

The present invention features a plastic package formed of thin plastic material to include a top and bottom which close together and are attached to define a plurality of channels extending along the length of the package into which can be fitted components such as electrical connectors. The top of the package is vacuum, or thermally, formed to define a series of longitudinal walls and a series of further structural walls extending transversely thereto which lends strength to the package in a structural sense. The bottom of the package is extruded to include specifically a plurality of rails which are centered upon the channels of the package and upon which the components rest for sliding movement in and out of the package. The rails are of a height greater than the legs of the components so that the components can ride with the legs free of the bottom of the package. A rod element is extended through one end of the package to lock the components therein.

In an alternative embodiment the invention is shown as a "breakaway" package comprising a plurality of separable units, each containing a plurality of connectors. In forming the alternative embodiment the corresponding tops of the top and bottom of the unit are sealed together and perforated at periodic intervals such that upon breaking the package along a row of perforations a smaller package having fewer units, or single unit packages may be obtained.

BRIEF DESCRIPTION OF THE DRAWINGS

FIG. 1 is an exploded perspective view showing the package of the invention in an exploded view in conjunction with a component of the type carried by the package and a locking element for holding such component within the package.

FIG. 2 is a perspective view of the portions of the package shown in FIG. 1 in a closed and fastened condition with the locking means in place.

FIG. 3 is a cross-sectional view from the end of the package shown in FIG. 2 having components loaded in the channels thereof and the locking member in place.

FIG. 7 is a perspective view of a single unit of the alternative embodiment of FIG. 4.

FIG. 8 is an end view of the package of FIG. 7.

DESCRIPTION OF THE INVENTION

Figure 4:
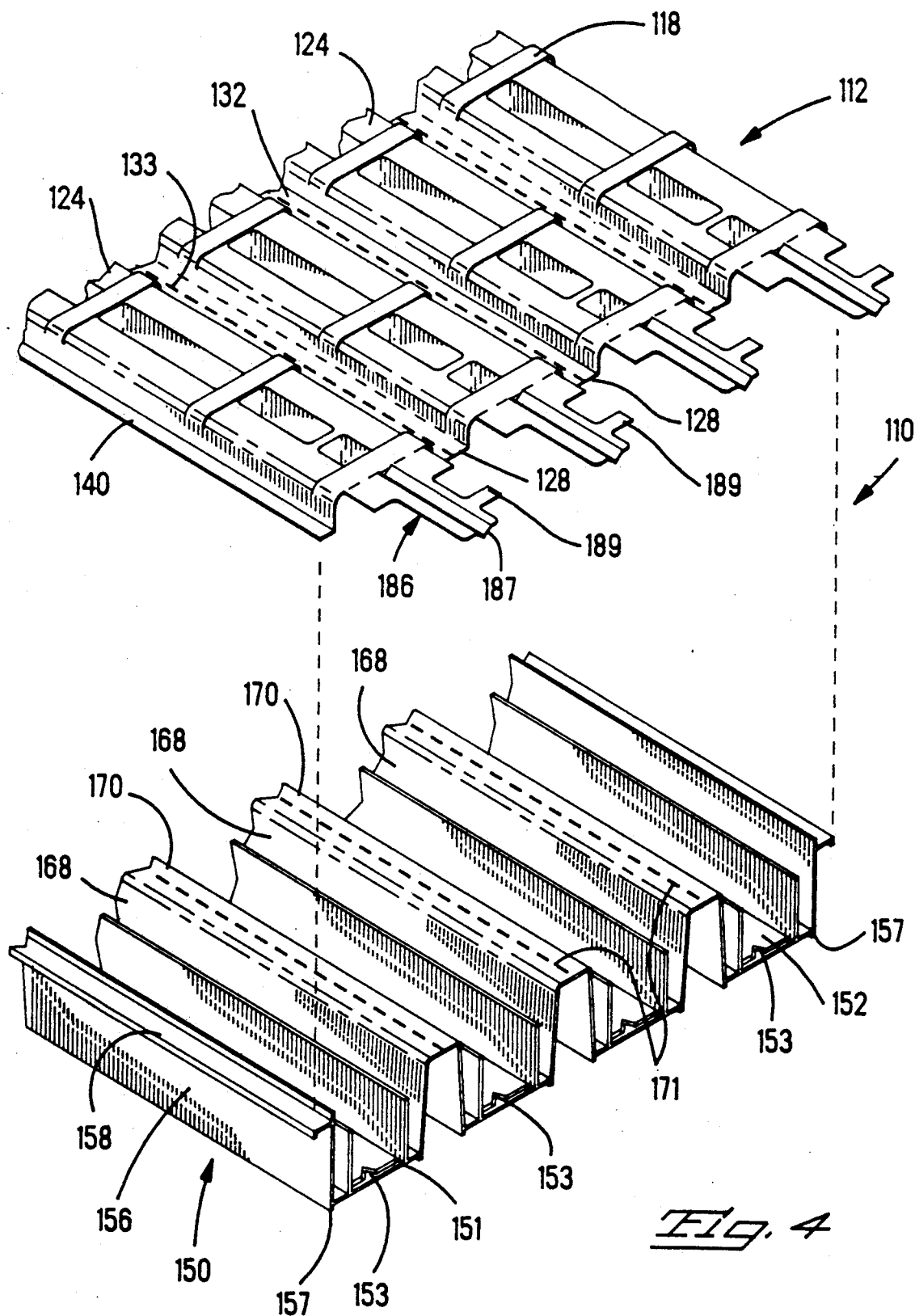
FIG. 4 is an exploded perspective view showing an alternative embodiment of the invention.

The package 10 of the invention includes a top 12 and a bottom 50 in an opened-up view to show detail. FIG. 1 also shows a component 80 of the type carried in package 10 and a locking element 86 utilized to lock components within the package. FIG. 2 shows the locking element in place within the assembled package, and FIG. 3 shows such element in place in conjunction with components loaded within the package.

Referring further to FIG. 1, the package top 12 includes a pair of outside side walls 14 with one end of the package closed by a wall 16 which extends between walls 14 and the opposite end 20 of package top 12 being open to provide an enlarged lead in. Periodically along the length of the top 12 are embossments 18 which extend down walls 14 and across to strengthen the package in a direction transverse to its length. Internally of walls 14 and extending along the length of the package top 12 are a series of projections 22 which define a series of channels 24 extending longitudinally along the package. The channels 24 are interrupted periodically proximate the site of the embossments 18 by end walls 26 which further strengthen the package in a cross-wise direction. The walls forming the projections 22 strengthen the package longitudinally. As shown in FIGS. 1 and 3, the center projection 28 includes a series of small rib-like structures 30 spaced apart to define a surface 32 having a function hereinafter to be described.

Additionally proximate open end 20 the top 12 includes a series of channels 34 extending transversely and through the top portions of projections 22 which lie along an axis including an aperture 36 and an aperture 38 in the walls 14 as shown in FIG. 1. These details serve a function to be described hereinafter. Extending outwardly along the outside edges of top 12 are flanges 40 as shown in FIG. 1.

The bottom 50 of package 10, as shown in FIGS. 1 and 3, is made to have a profile of essentially constant wall thickness, thereby allowing the bottom 50 to be extruded. The bottom 50 includes a base 52 having upstanding therefrom a series of wall sections 54 which define rails having upper surfaces 55 which will be discussed hereinafter. The outsides of the bottom includes side walls 56 containing flanges 58 dimensioned and positioned to receive the inner surfaces of the flanges 40 of the top 12. As can be seen from FIG. 3, the walls 56 have a vertical portion 62 which extends within the walls 14 of the top 12 when package 10 is assembled. The combination of the flanges 40 and 58, in conjunction with the fitting of the portion 62, assures a proper fit of a top 12 to a bottom 50. Flanges 40 and 58 further provide means to hold the package during loading and unloading of connectors from the package. The center of bottom 50 includes a central projection 68 which extends above the rails 54 and has a flat surface 70 which engages the surface 32 of top 12 in the manner shown in FIG. 3. The "A" frame shape further acts as a cushion to absorb some of the force caused by side shocks to the package.

When package 10 is assembled, the projections 30 on either side of surface 32 engage the upper and outer edges of projection 68 at the bottom to center the top 12 on the bottom 50, support the package 10 and provide rigidity thereto along the center of the package 10. With the top 12 placed on the bottom 50 in the manner shown in FIGS. 2 and 3, the outside flanges 40 and 58, as well as the surfaces 32 and 70, may be permanently bonded as by radio frequency or ultrasonic welding or through the use of adhesives compatible with the materials from which the plastics are manufactured. With this joining of top to bottom, a package is provided which is quite rigid longitudinally due essentially to the structural details, the inward projections and the rail sections and walls of the top and bottom; it is also relatively rigid crossways due to the end wall 16, embossments 18, and the end flange 20.

The package then is an envelope closed at the end by wall 16 and open at the opposite end for loading of components. One such component is shown representatively in FIG. 1 as a edge card connector 80 which includes a dielectric body 82 and two rows of electrical terminals having legs 84 extending beneath body 82. These terminals extend within the body 82 to contact portions, not shown. The terminals including legs 84 are typically formed of thin sheet metal such as brass or phosphor bronze having thickness ranging between 0.008 inches to 0.025 inches, for example, and which in many embodiments are relatively long and readily deformed. In one embodiment, for example, the length of legs 84 were on the order of 0.702 inches in length and spaced in rows 0.050 inches apart in one embodiment and as much as 0.50 inches apart in another embodiment. In practice, the components such as the connector 80 are installed into layered circuit boards through holes therein, the legs 84 being inserted simultaneously within an appropriate number of holes arranged in rows in accordance with predefined patterns. As can be appreciated, if one of the legs 84, perhaps one out of thirty or fifty is off-center, the connector cannot be loaded until such leg is straightened or brought back to its design position relative to the other legs. It is for this reason that it is important to protect such legs.

With the package 10 assembled as shown in FIG. 2, various components, such as connectors 80, may be readily loaded therein by being fed from an assembly machine such that the connectors are aligned with the channels 24 and pushed into channels 24 until the package 10 is loaded. The interior of the package is designed to allow the bodies 82 to slip along the channel 24 in a loose sliding fit with the interior of the top 12. The lower surfaces 83 of the connector bodies 82, as best seen in FIG. 3, rest upon the tops 55 of rails 54, with the legs 84 of the several rows of the connectors 80 extending downwardly alongside the rails 54.

When a package 10 is loaded, a locking element 86 as shown in FIGS. 1-3 is slipped into and through the aperture 36 and along channel 34 to emerge from the aperture 38 in the opposite wall 14 of the top 12. This can be seen best in FIG. 3. As best seen in FIG. 1, element 86 includes a round body 88 terminated at one end by a beveled portion 90 which facilitates insertion of the element and at the other end by a handle 92 which may be grasped for withdrawal. Preferably, the diameter of holes 36 and 38 is greater than the diameter of locking element 86 to facilitate insertion and withdrawal of element 86 from the package. The portion of the channel 34 in the projection 28 in the center of the top 12 is dimensioned to frictionally hold the locking element 86 in place. In use, the package 10 may be stacked vertically or on a slope so that when the locking element 86 is removed, the components will slide along the rails 54, down the channels 24, and out the end of the package 10 directly into assembly apparatus for loading connectors 80 into circuit boards. As can be seen in FIG. 3, the height of the rails 54 is appreciably greater than the length of the legs 84 so that the legs 84 do not engage portions of the package 10 during loading, unloading, and transport in the package. A number of different connectors, having different lengths of terminal legs can be packaged using the same size package. Furthermore, by changing the configuration of top 12, different width connectors may be packaged using the same bottom 50. As can also be seen in FIG. 3, the thickness of the rails 54 as well as the thickness of the remaining portions of the bottom 50, is substantially greater than the thickness of the top 12, the latter 12 being vacuum formed or thermoformed and the former 50 being extruded. The extrusion, including the thickness aforementioned, provides not only a more rigid package along the length thereof, but allows for a wall section defining the rail which has a height that is substantially greater than the thickness thereof.

In a practical embodiment of the invention, the top was formed of polyvinyl chloride sheet material on the order of 0.030 inches, and the bottom was formed of an extrusion material having a wall thickness on the order of 0.040 inches and are substantially rigid. The interior dimensions of the top were such in the region of the channels to loosely hold the connectors, bodies 82, for sliding movement. The walls forming rails 54 in the bottom were on the order of 0.750 inches in height.

The structure of the present invention further lends itself to being formed as a "breakaway" package as shown in FIGS. 4 through 8 wherein the package includes a plurality of separable units 111, each unit 111 as seen in FIGS. 7 and 8.

Referring now to FIG. 4, the "breakaway" package is formed of a thermal formed top 112 and an extruded base 150. As best seen in this figure extruded base 150 includes sides 156 having outwardly extending flanges 158 and a plurality of upwardly extending "A shaped" projections 168 having a row of perforations 171 extending along the top surface 170 thereof, each row of perforations providing a means of separating individual units 111 (shown in FIGS. 7 and 8) from the remaining package. Base 150 further includes a plurality of spaced notches 153 extending inwardly along the forward edge 151 thereof and downwardly extending legs 157.

Figure 5:
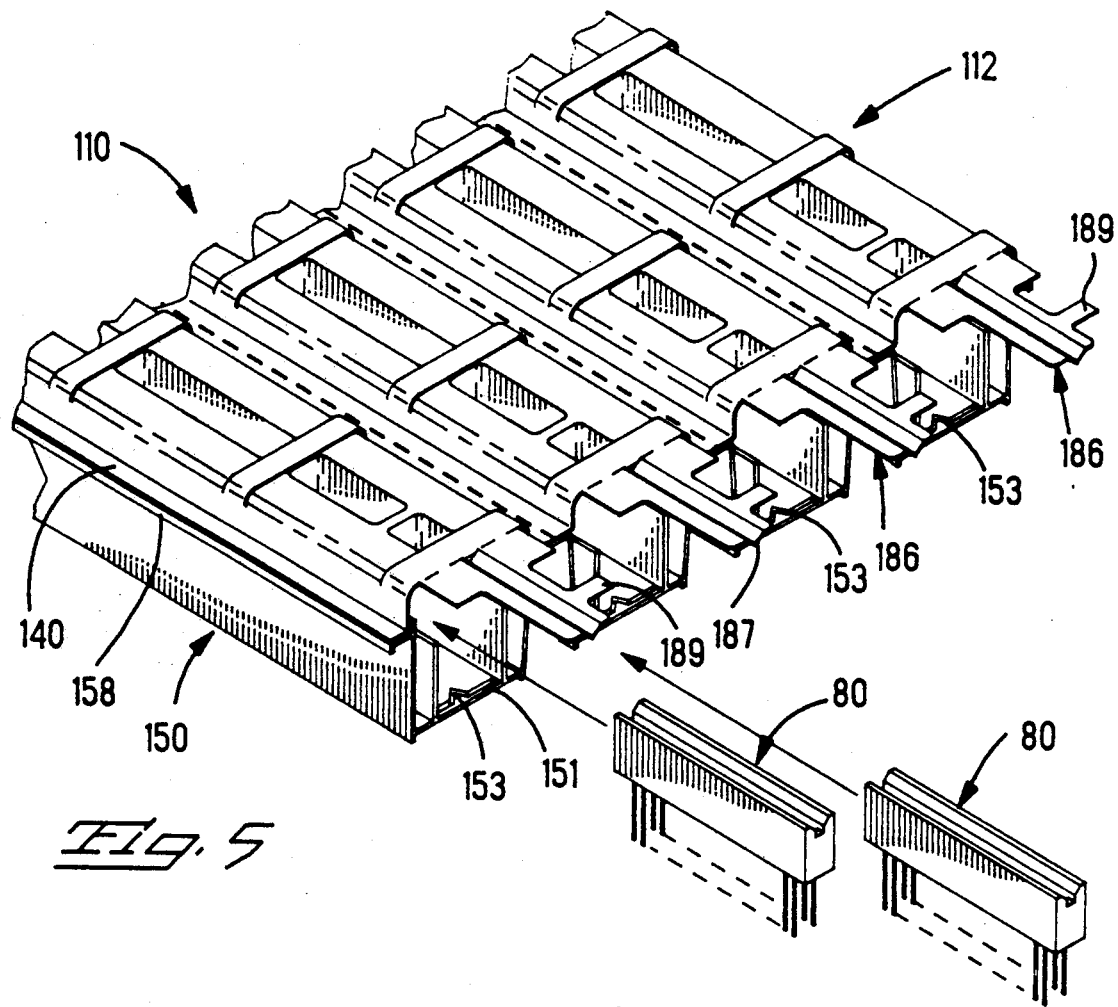
FIG. 5 is a perspective view of the assembled embodiment of FIG. 4 illustrating connectors being loaded therein.
Figure 6:
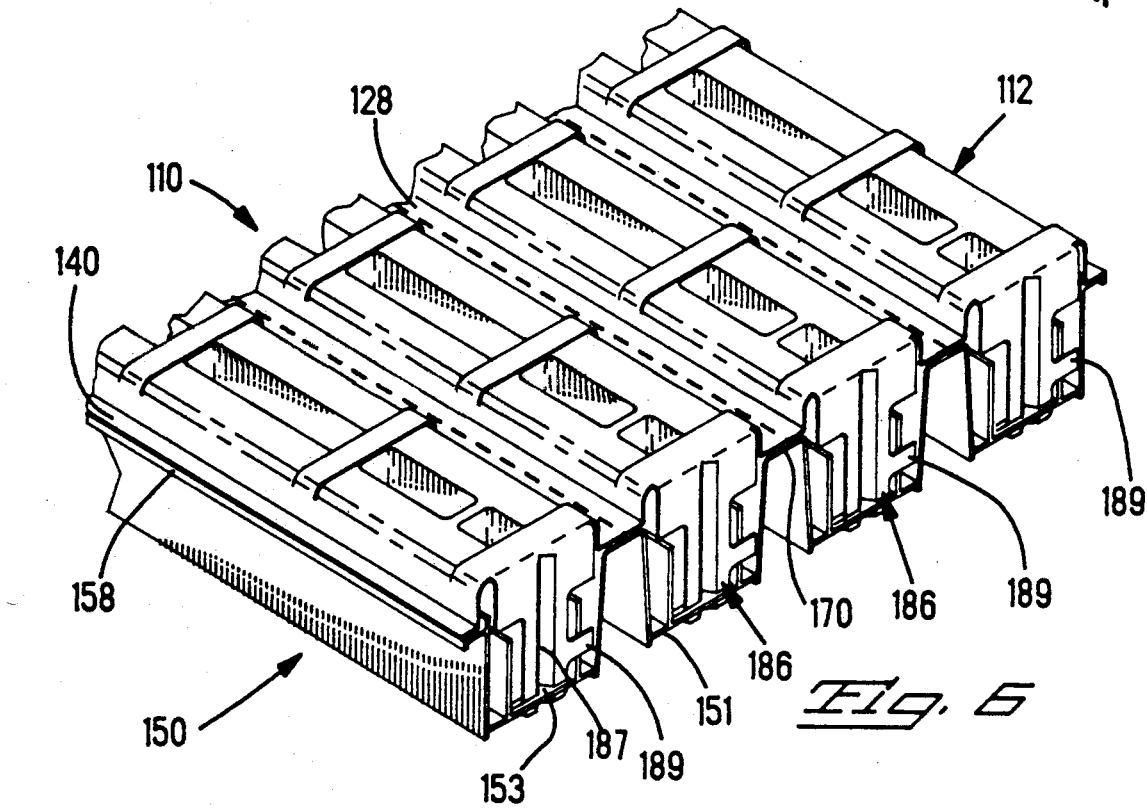
FIG. 6 is a view similar to FIG. 5 after loading the connectors and having the ends of the package closed and locked.

Top 112 is formed in a manner as previously described for top 12 of embodiment 10. As can be seen in FIGS. 4, 5 and 6, top 112 is divided into units comprising two terminal receiving channels 124 separated by channel 128 having upper surface 132 with a row of perforations 133 extending therethrough. Top 112 further includes a locking flap 186 extending from the forward end 120 of each subsection 111. The locking flap 186 includes downwardly and inwardly extending rib 187 and outwardly extending tab 189. In the assembled and locked package 110, as shown in FIG. 6, rib 187 is received into notch 153 at the forward end edge 151 of base 150. In the assembled breakaway package 110, channels 128 lie against surface 170 as shown in FIGS. 5 and 6 and are sealed thereto by radio frequency or ultrasonic welding or by adhesive means as are the corresponding outward extending flanges 140 and 158. As shown in FIG. 6, tab 187 extends along the forward edge of package 110 to facilitate the opening of the corresponding unit to load and remove terminals therein.

When assembled, the breakaway package 110 can be broken along the perforations, the upper and lower layers being centrally aligned so that the package may be broken into smaller units as desired, for example, a single unit 111 such as that shown in FIGS. 7 and 8. The multi-unit package allows ease of assembly and storage and yet provides flexibility in selecting the number of units desired.

Having now described the invention intended to enable those skilled in the art to practice a preferred embodiment thereof, I now set forth what is inventive through the appended claims.

I claim:

1. A package for housing components each having a cross-sectional profile including a body with rows of relatively long and fragile legs protruding from the body and spaced relatively close together, said package comprising:

a top and bottom which fit together to house and protect said components;

said top being comprised of a thermoformed plastic sheet material configured to define a plurality of channels extending therealong and a plurality of wall sections extending transversely to said channels for strengthening said top, said bottom being comprised of an extruded plastic material defining a first plurality of channels complementary to the channels of said top when the said top and bottom are fitted together to house said components, the said bottom including wall sections of solid extruded material of a thickness to provide rigidity along the length of the bottom and fit between the rows of legs of said components to slidingly support the component bodies attached thereto within the channels of the said top, the said wall sections defining thin solid rails having a height substantially greater than the thickness thereof, said height also being greater than the length of the said legs of components to facilitate loading and unloading of said package by virtue of said components sliding on the tops of said rails in said channels.

2. The package of claim 1 wherein the said wall sections defining said rails are on the order of 0.040 inches in thickness and on the order of 0.750 inches in height.

3. The package of claim 1 wherein said top includes a pair of apertures proximate one end thereof and a second plurality of channels aligned with the apertures extending through said first plurality of channels and transversely thereto and said package further includes a locking element extending through the apertures and through the channels to hold components within said package.

4. The package of claim 1 characterized in that the said components to be accommodated by said package have at least two rows of legs with said rows spaced apart on the order of between 0.050 and 0.150 inches and the said wall sections defining said rails are each on the order of 0.040 inches in thickness.

5. The package of claim 1 wherein said top and bottom of said package each comprise a plurality of integrally formed units, each unit including at least one channel for receiving connectors therein, each unit being joined to at least one adjacent unit by a respective perforated wall section, such that when said top and bottom of said package are joined, corresponding perforated wall sections of said top overly perforated wall sections of said bottom whereby upon severing said corresponding top wall sections of said package, the package can be divided into separate unit packages, each unit package having at least one component receiving channel therein.

6. A package for housing components each having a body with rows of fragile posts of a given length extending therefrom with a spacing between rows on the order of between 0.050 and 0.150 inches, comprising a top formed of plastic sheet material thermoformed to define longitudinal channels into which said components can be slidingly accommodated and protected; and a bottom of an extruded material and defining channels complementary to the channels of the top and having a plurality of rails projecting into the channels of the top, the rails having a height substantially greater than their thickness, said height being greater than the given length of the posts whereby said rails provide sliding support of said components within said package, said rails being defined by solid extruded plastic sections along the length of the said package with the top of the rails spaced from the inner surfaces of said top to facilitate loading and unloading and sliding engagement of the said components along said rails.

* * * * *